THERMOELECTRIC COOLING DEVICE

Filed April 18, 1962 3 Sheets-Sheet 1

INVENTOR.
THORE M. ELFVING
BY
Flehr and Swain
ATTORNEYS

INVENTOR.
THORE M. ELFVING
BY
Flehr and Swain
ATTORNEYS.

INVENTOR.
THORE M. ELFVING
BY
Flehr and Swain
ATTORNEYS.

3,225,549
THERMOELECTRIC COOLING DEVICE
Thore M. Elfving, 433 Fairfax Ave., San Mateo, Calif.
Filed Apr. 18, 1962, Ser. No. 188,337
7 Claims. (Cl. 62—3)

The present invention relates generally to thermoelectric heat pumps and more particularly to thermoelectric modules or packages including a thermocouple assembly comprising a series of thermocouples having legs of semiconductive material arranged with the cold junctions on one face and the hot junctions on the other face of the assembly.

It is desirable to build thermoelectric modules with thermocouple leg length as short as possible in order to increase the heat pumping capacity and best utilize the semiconductive material. It is also desirable that the legs are couples spaced a considerable distance apart so that there is provided large heat transmission surfaces for transmission of the increased heat flow due to the larger capacity. In conventional thermoelectric modules, the short leg lengths and larger spacing between the couples greatly increases heat leakage between the faces through the insulating medium in which the couple legs are embedded. The insulation losses have, therefore, hitherto been a limiting factor in the design of thermocouple assemblies.

Even with leakage through the insulation minimized, there will be certain edge losses. According to the present invention, the length of the edges in relation to the surface of the module can be reduced thereby reducing the edge losses.

Another problem is the construction of modules suitable for simple and efficient multistage cooling by so-called cascade systems.

It is a general object of the present invention to provide improved thermocouple assemblies or thermoelectric modules or packages.

It is a specific object of the present invention to provide a thermoelectric module in which the heat leakage from the hot junction side of the module to the cold junction side is minimized.

It is another object of this invention to provide thin thermoelectric modules or packages, made from thermocouples with short leg length, having large heat transfer surfaces with a minimum of heat loss through the module between the cold and hot junction sides, both inside the assembly between the semiconductor material and around the edges of the package.

Another object of the present invention is to provide thermocouple assemblies or modules with reduced edge losses in relation to the primary heat transfer surfaces of the module.

It is still another object of this invention to provide thermoelectric heat pumping packages which can conveniently be stacked or nested on one another to form multistage heat pumping devices or so-called cascade systems with a minimum of inside insulation losses and edge losses.

It is still another object of the present invention to provide a thermoelectric vacuum module.

Additional objects and features of the invention will appear from the following description in which several embodiments of the invention are described with reference to the accompanying drawings.

Referring to the drawings.

Figure 1:
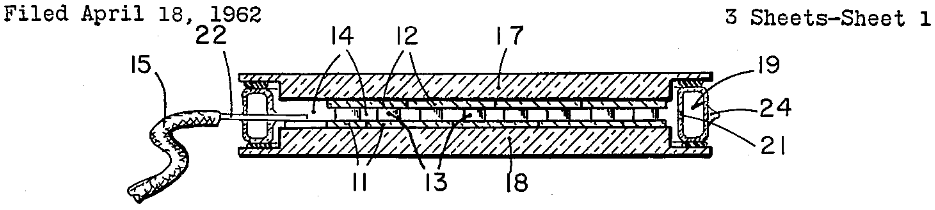
FIGURE 1 shows a sectional view of a thermoelectric module taken along the line 1—1 of FIGURE 2.
Figure 2:
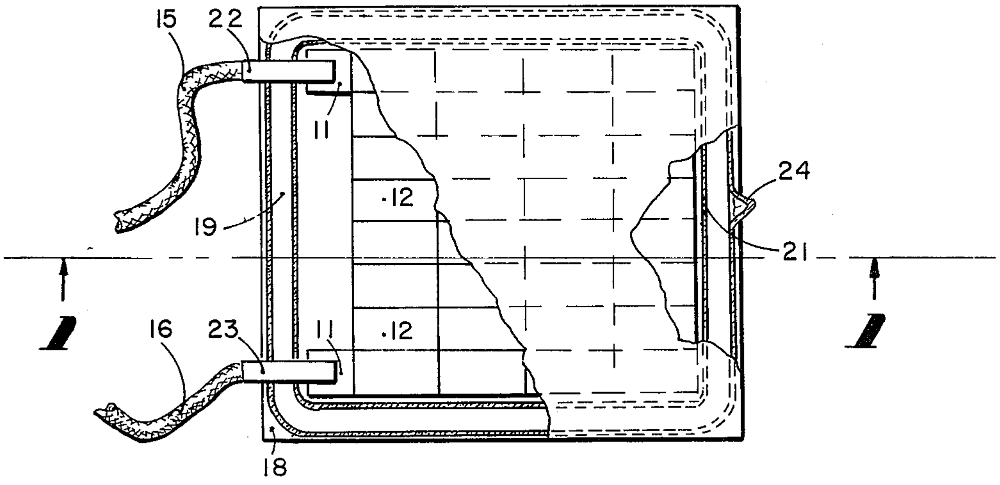
FIGURE 2 shows a plan view of a thermoelectric module.

FIGURES 1 and 2 show a thermoelectric assembly having serially connected thermocouples. In accordance with conventional practice, hot junction plates 11 and cold junction plates 12 are soldered to the legs 13 formed of semiconductive material. In accordance with the present invention, the legs 13 are relatively short, much shorter than illustrated by the drawing. Further, in accordance with the invention, the space 14 between the junctions not occupied by the legs 13 of the couples is empty, i.e., not filled with insulation material as in hitherto conventional thermoelectric modules. The serially connected thermocouples are connected to a power source by leads 15 and 16 which form ohmic contact with the first and last hot junctions.

The thermoelectric module is hermetically sealed in a package comprising spaced metal cover plates 17 and 18 sealed along their edges to a frame 19 made from a material with low heat conductivity. The plates may, for example, be sealed to the frame 19 with a suitable cement. In FIGURES 1 and 2, the frame 19 is glass. The frame may be made, for instance, from a glass pipe and set in an epoxy cement between the cover plates. The spaced plates 17 and 18 and the frame 19 form an envelope which encloses the thermocouple assembly including legs 13 and hot and cold junction plates 11 and 12. The inside of the hollow glass frame communicates with the interior 14 of the envelope through the hole 21. Metal electrodes 22 and 23 are inserted through the glass plates in sealing relationship therewith and provide the ohmic connection between the leads 15 and 16 and the first and last hot junction plates.

The envelope 14 is evacuated through a tubulation 24 which is pinched off to seal the envelope. The vacuum process is preferably carried out before the epoxy cement is completely set. The cover plates are consequently pressed against the junction plates with atmospheric pressure.

Instead of using a cement of the type described, a compressible gasket or packing made from a gas-tight material can be used for sealing the spaces between the glass frame and the cover plates.

Figure 3:
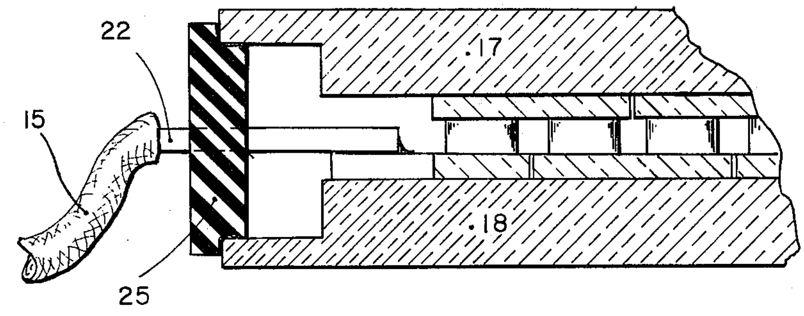
FIGURE 3 shows an enlarged sectional view of a portion of another thermoelectric module.

FIGURE 3 shows a solid frame 25 which can be made of plastic or similar material having low heat conductivity. Electrodes and an exhaust tubulation can be inserted through such a material in the usual way.

As an electric contact between the cover plates 17 and 18 and the junction plates 11 and 12 must be prevented, the cover plates or the junction plates are provided with an electric insulation which permits heat flow between the cover plates and the junction plates with a minimum temperature drop. This can be achieved in any known way as, for example, by applying a thin lacquer film between the metal parts. When the cover plates are made from aluminum, anodizing or similar processes may provide a sufficient electric insulation. Metal ceramic techniques may also be employed.

The pressure or suction of the vacuum ensures a good contact without the use of any glue, cement or similar compound at the junction plates and the whole package is held together by the vacuum without any other mechanical means.

In order to minimize the radiation losses between the two heat transfer surfaces, either between exposed portions of the hot and cold junction plates or the cover plates, the surfaces of which face each other between the couple legs are polished or silvered so that the emissivity of the exposed surfaces is low. In this way, the thermoelectric vacuum assembly will be similar to a vacuum bottle as far as inside insulation losses are concerned and the efficiency of the thermocouple assembly as a heat pump will be substantially independent of the leg length and of the spacing between legs. The semiconductive rod material in the legs can be soldered to large junction plates which can be spaced apart without increasing inside insulation losses, and the leg length can be cut very short, in the order of 1 to 2 mm. The modules can be operated with a current corresponding to the maximum coefficient of performance. With the short leg length this current will be close to the maximum current density allowed by the resistance in the solder joint and the semiconductive material will consequently be fully utilized.

A thermoelectric module of the described type will have certain losses between the hot and cold junction sides around the edges of the cover plates. In order to make the edge losses independent of the couple leg length, the cover plates can be made of considerable thickness and thinned at the edges by cutting away material as illustrated by the drawings. The frame and the sealing compound are placed in this groove around the edges whereby the height of the frame is considerably greater than the couple leg length. Thus, the edge losses are reduced. Other measures with the same effect are obvious.

The thermoelectric module can be applied directly to metal surfaces. If the cover plates are made of copper or brass, the package can be soldered to similar metals and the total temperatured rop from the junction plates to final heat absorbing or heat dissipating surfaces minimized.

Figures 4, 5:
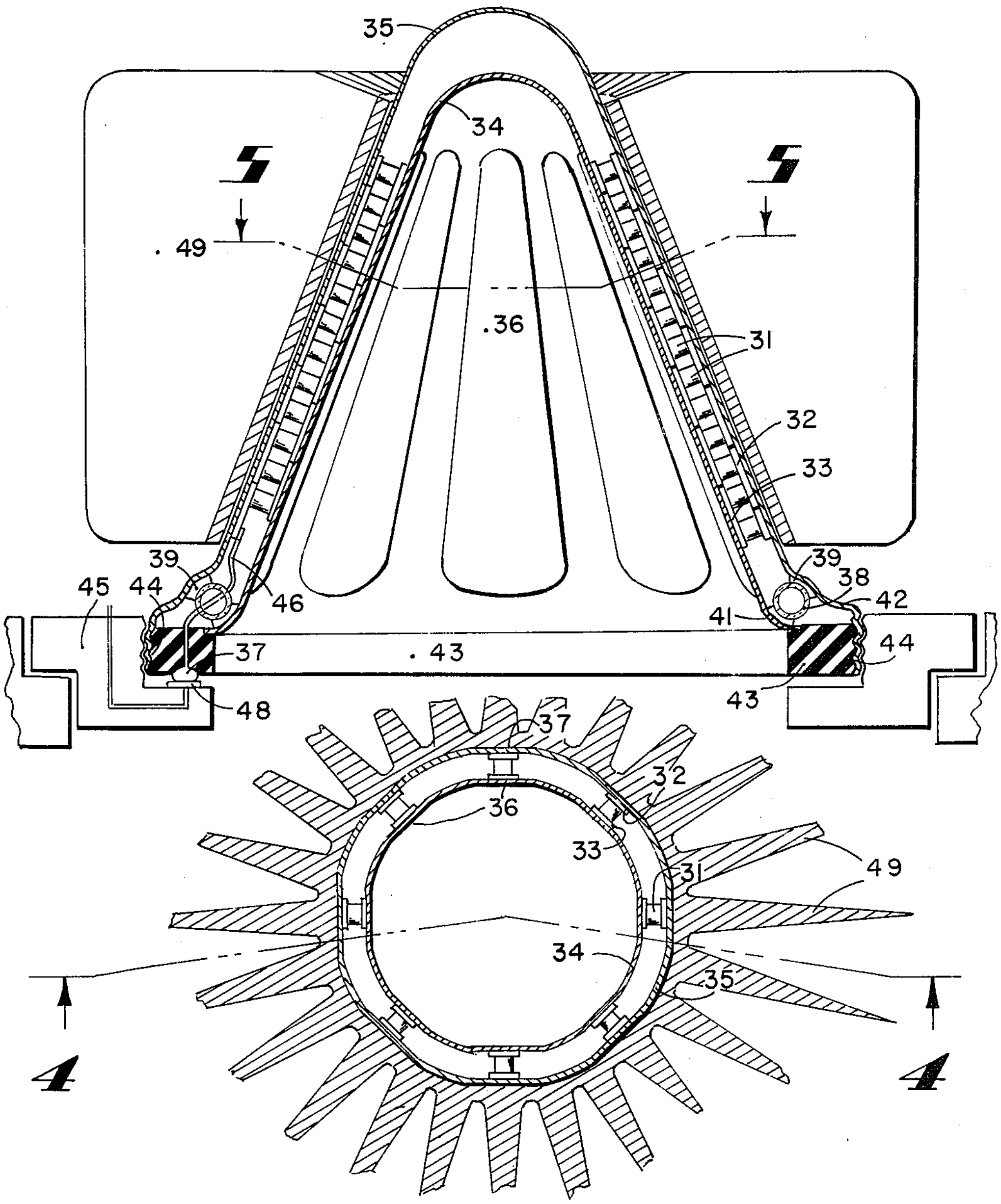
FIGURE 4 shows a sectional view, taken along the line 4—4 of FIGURE 5, of another thermoelectric module with the thermocouples arranged in a cone-shaped assembly including a flange for connection to a refrigerated space.
FIGURE 5 shows a sectional view, taken along the line 5—5 of FIGURE 4, of the thermoelectric module.

In FIGURES 4 and 5 is shown another thermoelectric vacuum unit according to the invention. The thermocouples are in the usual way built with legs 31 united by hot and cold junction plates 32 and 33, respectively. The thermocouples are mounted in straight rows with the cold junction plates 33 in contact with a metal cone 34, and the hot junction plates 32 in contact with a spaced concentric metal cone 35. The cones are preferably provided with spaced flattened areas or strips 36 and 37 about their periphery. In this way, a plane contact surface is provided between the junction plates 32 and 33 and the cooperating surfaces 36 and 37 of the metal cones which is independent of the radius of curvature at various points of the cones. The flattened areas or strips are, in general, narrower and spaced closer together at the top than at the bottom portion of the cones. The mounting will leave considerable exposed areas between the thermocouples, that is, areas where the cold side cone is facing the hot side cone without any material in-between. The cones 34 and 35 are sealed to a frame or ring 38 by a suitable compound 39 between grooves or flanges 41 and 42, respectively, on the cold and hot side cones.

The frame 38 shown in FIGURE 4 comprises a hollow glass ring set between the cone flanges 41 and 42 in epoxy or similar hardening cement and provided with an exhaust pipe (not shown) for pulling a vacuum in the space between the two cones. When the vacuum is created, the two cones will be pressed together with a force corresponding to atmospheric pressure and area of the cones and the compound 39, which can be substituted by suitable rubber gaskets of similar packing, is compressed until the flat areas of the cones are in intimate contact with the junction plates.

The assembly may be provided with a finishing ring 43 made of low heat conductive material. This ring 43 can, according to the invention, be threaded at 44 for attachment to a panel 45. The panel 45 may be inserted in the ceiling or walls of a container or structure to be refrigerated by the thermoelectric unit.

The thermocouples in the several rows can be connected electrically in any desired way but preferably with the couples in the same row in series with each other. The first of a series of hot junctions can be connected to a power supply by a terminal lead 46 inserted through the glass frame 38. One end of the lead is connected to the hot junction plate, and the other end is connected to the electric contact plate 37 which, in turn, contacts the electric contact ring 48 at the base of the thread in the panel 45.

Standardized thermoelectric assemblies or heat pump units in such panels can be attached in required number to a structure to be refrigerated. The hot side of the double cone structure can dissipate the heat to the air directly or by an attached fin radiator 49. The cold side of the unit offers much larger heat absorbing surfaces than conventional thermoelectric modules and will absorb heat with a high heat transmission coefficient when placed in the indicated position on the top of a structure.

The angle of the cones can vary. Even concentric cylinders closed at one end and with the edges at the other end sealed together to form a vacuum bottle can be used. The flattened areas and the gauge of the metal are chosen so that the vacuum presses the flattened areas on both sides against the respective junction plates. In the same way, concentric metal cubes can be used, one inside the other, with thermoelectric modules separating the sides of the cubes, and with the edges sealed in the way described.

The cone surfaces and/or the junction plates are provided with an electric insulation in any known way as mentioned above. Anodized aluminum cones are suitable in this respect. The thermocouples enclosed between the two cones occupy only a minor portion of the total cone area and the primary heat absorbing and heat dissipating areas represented by the surfaces of the double cone structure are, therefore, several times larger than the corresponding area of ordinary flat modules with a conventional mounting. The edge length is, on the contrary, small in relation to this heat transmission area. In order to minimize radiation losses between the hot and cold sides of the thermoelectric cone unit, the exposed surfaces of both the junction plates and the cones facing each other are polished or silvered to obtain minimum emissivity.

A common ratio between the total section area of the semiconductive leg material and the total module area has hitherto used thermocouple assemblies or modules between 0.25 to .50 for thermocouples with round legs, and up to 0.8 for thermocouples made from thermoelectric rod material of square or rectangular cross-section. In modules according to the present invention, the junction plate area represents only a small fraction of the primary heat transfer surface on each side of the module and the ratio between the total section area of the semiconductive leg material and the primary heat transfer surface area on each side of the module is in units according to the invention usually below .1 and in many cases below .05. With a primary heat transfer area many times larger than the total section area of the thermoelectric leg material, a thermocouple assembly according to the present invention often can operate without secondary heat transfer surfaces such as fins. Other advantages are illustrated by the practical applications described below.

With the vacuum bottle design, the capacity of a double cone unit can vary greatly without affecting the efficiency. The capacity can be varied by the number of thermocouples mounted between the two cones or by applying higher or lower direct current to the thermocouples. It is possible to build thermoelectric cascade units in several stages simply by nesting double cone units of varying capacity inside each other. The concentric shape of the preferably stamped metal cones combined with the large primary contact surfaces guarantees a very high heat transfer rate between two adjacent stages, while at the same time the edge losses between stages of different temperatures are low. The final heat dissipating surface of the cascade can be cooled by a heat sink in any known way and the cascade can be operated so that the final low temperature surface will be either on the inside or the outside of a cone depending upon the purpose of the cascade.

Figure 6:
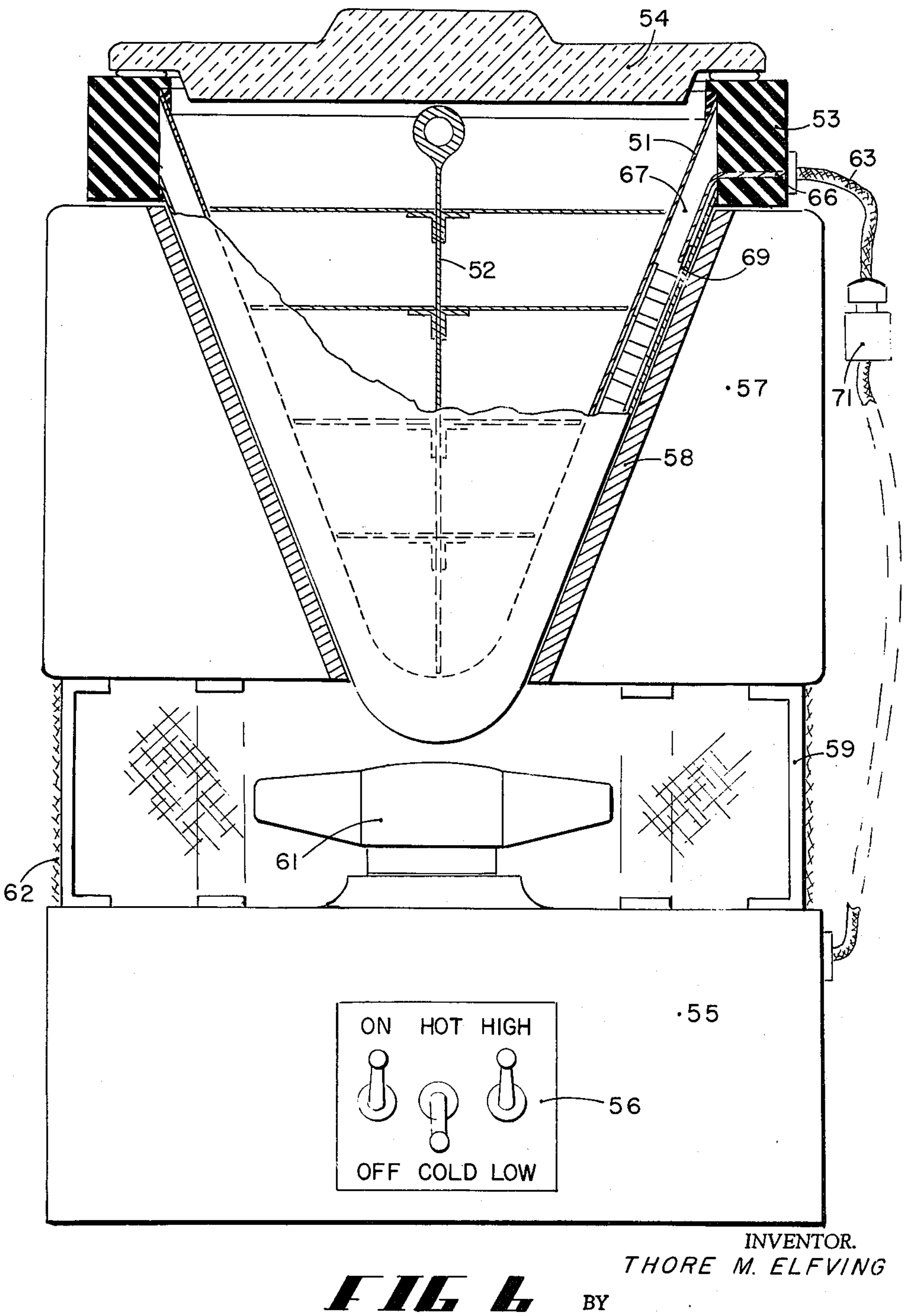
FIGURE 6 is a side elevational view, partly in section, of an air-cooled ice freezer or cooler/heater according to the invention.

In FIGURE 6 is shown how a thermoelectric vacuum unit of the conical type is used as an air-cooled ice freezer or combination cooler-heater. The inside cone 51 on the cold junction side of a thermoelectric vacuum unit of the type described with respect to FIGURES 4 and 5 serves as a container for the water to be frozen. An emersed metal fin structure 52 divides the content into ice "cubes" of suitable size. The double cone vacuum unit with its sealing ring 53 made from a suitable plastic material is provided with an insulated lid 54, which is the only insulation needed in this design, the container 51 being elsewhere completely surrounded by the thermoelectric vacuum unit. The electric direct current supply 55 can be arranged in any known way and a switch box 56 can be provided with a two-way switch so that the current can be reversed for defrosting or heating of the contents in the inner cone as indicated on the drawing. The double cone thermoelectric vacuum unit is on the heat dissipating side in close contact with a heat sink in the form of a cast fin radiator 57 with a conical center 58 matching the outside cone. The radiator 57 is placed on a stand 59 on top of the power supply 55. A fan 61, placed in the center of the stand 59, provides forced air circulation around the fin radiator 57 sucking the air through the screen 62.

The thermoelectric vacuum unit is supplied with direct current from the power supply through the lead 63 over an electrode 66 inserted into the evacuated space 67, through the sealing frame 53 and connected to the first hot junction plate 69 of the thermocouple assembly. The return current from the last hot junction plate is connected in a similar way. The double cone unit can be wholly disconnected by disconnecting the plug 71 and can be used like an ordinary container. By nesting it in the radiator 57 and closing the electric circuit, it can again be operated as a freezing or heating device according to the setting of the switches in the switch box 56. When the current is reversed and the contents of the container 51 are heated, the radiator 57 serves as a heat absorber for the thermoelectric heat pump unit. The radiator 57 can be substituted by other known types of heat sink cooled by running water, air or other means.

Thermoelectric vacuum modules of the type described can be combined with refrigerated containers or boxes in a multitude of ways. A cone unit of suitable angle can form the top or bottom of a box according to design requirement and the inside or the outside cone can be the cold side. The hot side of the cone unit can be attached to heat sinks of various types.

Thus, there is provided a thermoelectric module which provides relatively large heat transfer surfaces with relatively small junction plate areas and close spacing of the surfaces of the module, and yet has relatively low heat leakage between the heat transfer surfaces through the module. This minimizes the amount of semiconductive material required for a module of a given heat pumping capacity.

I claim:

1. A thermoelectric heat pump assembly having hot and cold sides formed by spaced cover plates comprising a plurality of thermoelectric elements having their ends secured directly to hot and cold junction plates, said thermoelectric elements each having a length which is less than three millimeters and also less than its major cross-sectional dimension, said junction plates being electrically insulated from and in thermal contact with the corresponding cover plate, means providing a seal along the edge of said cover plates to form therewith an evacuated envelope surrounding said thermocouples, and conductor means extending into said envelope for supplying electrical energy to said thermoelectric elements.

2. A thermoelectric heat pump assembly as in claim 1 wherein said means providing a seal along the edge of the cover plates comprises a material having a low thermal conduction and presenting a conduction path between the cover plates which has a length greater than the length of the thermoelectric elements.

3. A thermoelectric heat pump assembly as in claim 2 wherein the edges of said cover plates are thin in comparison to the remainder of the cover plates with the thin sections joined to the sealing means.

4. A thermoelectric heat pump assembly as in claim 1 wherein said thermoelectric elements have a projected area in the direction of the cover plates which does not exceed 0.1 times the area of the cover plates.

5. A thermoelectric heat pump assembly as in claim 1 wherein the exposed portions of said junction plates and said cover plates facing each other across the empty space between the ends of said thermoelectric elements have a low emissivity.

6. A thermoelectric heat pump assembly having hot and cold junction sides formed by spaced cover plates defining a surface of revolution, said spaced cover plates having opposed portions which are relatively flat, a plurality of short thermoelectric elements having their ends secured directly to hot and cold junction plates, said thermoelectric elements having a length which is less than the major cross-sectional dimension of said junction plates, said junction plates electrically insulated from and in thermal contact with the flat portions of the corresponding cover plates, said thermoelectric elements having a projected area in the direction of the cover plates which does not exceed .2 times the area of said cover plates, the exposed portions of said junction plates and said cover plates facing each other across the empty space between the ends of said thermoelectric elements having a low heat emissivity, means having low thermal conductance providing a seal between said cover plates along the edge to form therewith an evacuated envelope surrounding said thermocouples, and conductor means extending into said envelope for supplying electrical energy to said thermoelectric elements.

7. A thermoelectric cooling device having hot and cold junction sides having side walls formed by spaced interior and exterior cover plates each defining surfaces of revolution having a closed bottom and an open top to form a cooling container, a plurality of short thermoelectric elements having their ends secured directly to hot and cold junction plates, said hot junction plate being electrically insulated from and in thermal contact with the exterior cover plate and the cold junction plates being electrically insulated from and in thermal contact with the interior cold cover plate, means providing a seal along the edge of said cover plates to form therewith an evacuated envelope and a heat dissipating means in thermal contact with the exterior cover plate whereby the heat pumped from the interior of the container is dissipated to the surrounds.

References Cited by the Examiner

UNITED STATES PATENTS

| | | | |
|---|---|---|---|
| 1,848,655 | 3/1932 | Petrik | 136—4.2 |
| 2,864,879 | 12/1958 | Toulmin | 136—4.62 |
| 2,984,696 | 5/1961 | Shaffer | 136—4.62 |
| 3,035,109 | 5/1962 | Sheckler | 136—4.2 |
| 3,054,840 | 9/1962 | Alsing | 62—3 |

WILLIAM J. WYE, *Primary Examiner.*

JOHN H. MACK, *Examiner.*